(12) United States Patent
Huemoeller et al.

(10) Patent No.: US 7,312,103 B1
(45) Date of Patent: Dec. 25, 2007

(54) METHOD FOR MAKING AN INTEGRATED CIRCUIT SUBSTRATE HAVING LASER-EMBEDDED CONDUCTIVE PATTERNS

(75) Inventors: Ronald Patrick Huemoeller, Chandler, AZ (US); Sukianto Rusli, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 200 days.

(21) Appl. No.: 11/021,977

(22) Filed: Dec. 22, 2004

Related U.S. Application Data

(63) Continuation of application No. 10/138,225, filed on May 1, 2002, now Pat. No. 6,930,256.

(51) Int. Cl.
*H01L 21/44* (2006.01)

(52) U.S. Cl. .................. 438/106; 438/108; 438/622

(58) Field of Classification Search ............... 438/106, 438/125, 126; 257/698, 700, 701
See application file for complete search history.

(56) References Cited

U.S. PATENT DOCUMENTS

| | | | |
|---|---|---|---|
| 3,868,724 A | 2/1975 | Perrino | 357/65 |
| 3,916,434 A | 10/1975 | Garboushian | 357/74 |
| 4,322,778 A | 3/1982 | Barbour et al. | |
| 4,366,342 A * | 12/1982 | Breedlove | 174/557 |
| 4,532,419 A | 7/1985 | Takeda | 235/492 |
| 4,642,160 A | 2/1987 | Burgess | |
| 4,685,033 A | 8/1987 | Inone | |
| 4,706,167 A | 11/1987 | Sullivan | 361/406 |
| 4,716,049 A | 12/1987 | Patraw | 427/96 |
| 4,786,952 A | 11/1988 | MacIver et al. | 357/23.4 |
| 4,811,082 A | 3/1989 | Jacobs et al. | |
| 4,897,338 A | 1/1990 | Spicciati et al. | 430/314 |
| 4,905,124 A | 2/1990 | Banjo et al. | 361/395 |
| 4,964,212 A | 10/1990 | Deroux-Dauphin et al. | 29/852 |
| 4,974,120 A | 11/1990 | Kodai et al. | 361/392 |
| 4,996,391 A | 2/1991 | Schmidt | 174/255 |

(Continued)

FOREIGN PATENT DOCUMENTS

JP 05-109975 4/1993

(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

*Primary Examiner*—Long Pham
(74) *Attorney, Agent, or Firm*—Gunnison, McKay & Hodgson, L.L.P.; Serge J. Hodgson

(57) ABSTRACT

A method for making an integrated circuit substrate having laser-embedded conductive patterns provides a high-density mounting and interconnect structure for integrated circuits. A dielectric material is injection-molded or laminated over a metal layer that is punched or etched. The metal layer can provide one or more power planes within the substrate. A laser is used to ablate channels on the surfaces of the outer dielectric layer for the conductive patterns. The conductive patterns are electroplated or paste screen-printed and an etchant-resistive material is applied. Finally, a plating material can be added to exposed surfaces of the conductive patterns. An integrated circuit die and external terminals can then be attached to the substrate, providing an integrated circuit having a high-density interconnect.

20 Claims, 4 Drawing Sheets

U.S. PATENT DOCUMENTS

| | | | |
|---|---|---|---|
| 5,021,047 A | 6/1991 | Movern | |
| 5,072,075 A | 12/1991 | Lee et al. | |
| 5,081,520 A | 1/1992 | Yoshii et al. | 357/80 |
| 5,108,553 A | 4/1992 | Foster et al. | 205/125 |
| 5,110,664 A | 5/1992 | Nakanishi et al. | 428/195 |
| 5,191,174 A | 3/1993 | Chang et al. | |
| 5,229,550 A | 7/1993 | Birdra et al. | |
| 5,239,448 A | 8/1993 | Perkins et al. | |
| 5,247,429 A | 9/1993 | Iwase et al. | 362/29 |
| 5,283,459 A | 2/1994 | Hirano et al. | 257/419 |
| 5,371,654 A | 12/1994 | Beaman et al. | 361/744 |
| 5,379,191 A | 1/1995 | Carey et al. | 361/777 |
| 5,404,044 A | 4/1995 | Booth et al. | |
| 5,463,253 A | 10/1995 | Waki et al. | 257/724 |
| 5,474,957 A | 12/1995 | Urushima | 437/209 |
| 5,474,958 A | 12/1995 | Djennas et al. | 437/211 |
| 5,508,938 A | 4/1996 | Wheeler | |
| 5,530,288 A | 6/1996 | Stone | 257/700 |
| 5,531,020 A | 7/1996 | Durand et al. | 29/840 |
| 5,574,309 A | 11/1996 | Papapietro et al. | 257/679 |
| 5,581,498 A | 12/1996 | Ludwig et al. | 365/63 |
| 5,582,858 A | 12/1996 | Adamopoulos et al. | 427/96 |
| 5,616,422 A | 4/1997 | Ballard et al. | 428/621 |
| 5,637,832 A | 6/1997 | Danner | 174/260 |
| 5,674,785 A | 10/1997 | Akram et al. | 437/217 |
| 5,719,749 A | 2/1998 | Stopperan | 361/769 |
| 5,739,581 A | 4/1998 | Chillara | 257/668 |
| 5,739,585 A | 4/1998 | Akram et al. | 257/698 |
| 5,739,588 A | 4/1998 | Ishida et al. | 257/782 |
| 5,742,479 A | 4/1998 | Asakura | 361/737 |
| 5,774,340 A | 6/1998 | Chang et al. | |
| 5,784,259 A | 7/1998 | Asakura | 361/752 |
| 5,798,014 A | 8/1998 | Weber | 156/263 |
| 5,822,190 A | 10/1998 | Iwasaki | 361/737 |
| 5,826,330 A | 10/1998 | Isoda et al. | 29/852 |
| 5,835,355 A | 11/1998 | Dordi | 361/760 |
| 5,847,453 A | 12/1998 | Uematsu et al. | |
| 5,894,108 A | 4/1999 | Mostafazadeh et al. | 174/52.4 |
| 5,903,052 A | 5/1999 | Chen et al. | 257/706 |
| 5,936,843 A | 8/1999 | Ohshima et al. | 361/760 |
| 5,952,611 A | 9/1999 | Eng et al. | 174/52.4 |
| 6,004,619 A | 12/1999 | Dippon et al. | 427/97 |
| 6,013,948 A | 1/2000 | Akram et al. | 257/698 |
| 6,021,564 A | 2/2000 | Hanson | 29/852 |
| 6,028,364 A | 2/2000 | Ogino et al. | 257/778 |
| 6,034,427 A | 3/2000 | Lan et al. | 257/698 |
| 6,040,622 A | 3/2000 | Wallace | 257/679 |
| 6,060,778 A | 5/2000 | Jeong et al. | 257/710 |
| 6,069,407 A | 5/2000 | Hamzehdoost | 257/774 |
| 6,072,243 A | 6/2000 | Nakanishi | 257/783 |
| 6,081,036 A | 6/2000 | Hirano et al. | |
| 6,119,338 A | 9/2000 | Wang et al. | 29/852 |
| 6,122,171 A | 9/2000 | Akram et al. | 361/704 |
| 6,127,833 A | 10/2000 | Wu et al. | 324/755 |
| 6,160,705 A | 12/2000 | Stearns et al. | 361/704 |
| 6,172,419 B1 | 1/2001 | Kinsman | 257/737 |
| 6,175,087 B1 | 1/2001 | Keesler et al. | |
| 6,184,463 B1 | 2/2001 | Panchou et al. | 174/52.4 |
| 6,204,453 B1 | 3/2001 | Fallon et al. | |
| 6,214,641 B1 | 4/2001 | Akram | 438/107 |
| 6,235,554 B1 | 5/2001 | Akram et al. | 438/109 |
| 6,239,485 B1 | 5/2001 | Peters et al. | |
| D445,096 S | 7/2001 | Wallace | D14/117 |
| D446,525 S | 8/2001 | Okamoto et al. | D14/436 |
| 6,274,821 B1 | 8/2001 | Echigo et al. | 174/255 |
| 6,280,641 B1 | 8/2001 | Gaku et al. | 216/17 |
| 6,316,285 B1 | 11/2001 | Jiang et al. | 438/106 |
| 6,351,031 B1 | 2/2002 | Iijima et al. | |
| 6,353,999 B1 | 3/2002 | Cheng | 29/852 |
| 6,365,485 B1 | 4/2002 | DiStefona et al. | |
| 6,365,975 B1 | 4/2002 | DiStefano et al. | 257/777 |
| 6,376,906 B1 | 4/2002 | Asai et al. | |
| 6,392,160 B1 | 5/2002 | Andry et al. | 174/261 |
| 6,395,578 B1 | 5/2002 | Shin et al. | 438/106 |
| 6,405,431 B1 | 6/2002 | Shin et al. | 29/852 |
| 6,406,942 B2 | 6/2002 | Honda | 438/119 |
| 6,407,341 B1 | 6/2002 | Anstrom et al. | 174/255 |
| 6,407,930 B1 | 6/2002 | Hsu | 361/784 |
| 6,451,509 B2 | 9/2002 | Keesler et al. | 430/311 |
| 6,479,762 B2 | 11/2002 | Kusaka | 174/261 |
| 6,497,943 B1 | 12/2002 | Jimarez et al. | 428/209 |
| 6,517,995 B1 | 2/2003 | Jacobson et al. | 430/320 |
| 6,534,391 B1 | 3/2003 | Huemoeller et al. | 438/612 |
| 6,544,638 B2 | 4/2003 | Fischer et al. | 428/322.7 |
| 6,586,682 B2 | 7/2003 | Strandberg | 174/255 |
| 6,586,835 B1 * | 7/2003 | Ahn et al. | 257/717 |
| 6,608,757 B1 | 8/2003 | Bhatt et al. | |
| 6,660,559 B1 | 12/2003 | Huemoeller et al. | 438/106 |
| 6,667,229 B1 * | 12/2003 | Lin et al. | 438/611 |
| 6,715,204 B1 | 4/2004 | Tsukada et al. | 29/847 |
| 6,727,645 B2 | 4/2004 | Tsujimura et al. | 313/504 |
| 6,730,857 B2 | 5/2004 | Konrad et al. | 174/257 |
| 6,753,612 B2 | 6/2004 | Adae-Amoakoh et al. | 257/774 |
| 6,787,443 B1 | 9/2004 | Boggs et al. | 438/612 |
| 6,803,528 B1 | 10/2004 | Koyanagi | 174/262 |
| 6,815,709 B2 | 11/2004 | Clothier et al. | |
| 6,815,739 B2 | 11/2004 | Huff et al. | 257/275 |
| 7,049,693 B2 * | 5/2006 | Canella | 257/690 |
| 2002/0017712 A1 | 2/2002 | Bessho et al. | 257/700 |
| 2003/0128096 A1 | 7/2003 | Mazzochette | 338/22 |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |

* cited by examiner

METHOD FOR MAKING AN INTEGRATED CIRCUIT SUBSTRATE HAVING LASER-EMBEDDED CONDUCTIVE PATTERNS

CROSS-REFERENCE TO RELATED APPLICATIONS

The present application is a continuation of U.S. patent application Ser. No. 10/138,225 entitled "INTEGRATED CIRCUIT SUBSTRATE HAVING LASER-EMBEDDED CONDUCTIVE PATTERNS AND METHOD THEREFOR", filed on May 1, 2002 now U.S. Pat. No. 6,930,256, and is further related to U.S. patent application Ser. No. 09/931,144 filed Aug. 16, 2001 issued as U.S. Pat. No. 6,784,376, both by the same inventors and assigned to the same assignee. The specifications of the above-referenced patent applications are herein incorporated by reference.

FIELD OF THE INVENTION

The present invention relates generally to semiconductor packaging, and more specifically, to a substrate having laser-embedded conductive patterns for providing electrical inter-connection within an integrated circuit package.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit. For this purpose, many types of packaging have been developed, including "flip-chip", ball grid array and leaded grid array among other mounting configurations. These configurations typically use a planar printed circuit etched on the substrate with bonding pads and the connections to the die are made by either wire bonding or direct solder connection to the die.

The resolution of the printed circuit is often the limiting factor controlling interconnect density. Photo-etch and other processes for developing a printed circuit on a substrate have resolution limitations and associated cost limitations that set the level of interconnect density at a level that is less than desirable for interfacing to present integrated circuit dies that may have hundreds of external connections.

As the density of circuit traces interfacing an integrated circuit die are increased, the inter-conductor spacing must typically be decreased. However, reducing inter-conductor spacing has a disadvantage that migration and shorting may occur more frequently for lowered inter-conductor spacings, thus setting another practical limit on the interconnect density.

Therefore, it would be desirable to provide a method and substrate having improved interconnect density with a low associated manufacturing cost. It would further be desirable to provide a method and substrate having reduced susceptibility to shorting and migration between conductors.

SUMMARY OF THE INVENTION

A substrate having laser-embedded conductive patterns and a method for manufacturing generate a circuit pattern within a substrate having circuits embedded beneath the surface of the substrate. An outer dielectric layer is injection molded or laminated over a thin metal layer and channels outlining a desired circuit pattern are cut in the surface of the plastic layer using a laser. Conductive material is then plated or paste screened into the channels. The thin metal layer may be etched, mechanically drilled or punched to provide through holes for vias and to create separate power and ground paths within the metal layer. The process can be extended to multiple layers to create a sandwich structure for multilayer applications.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

The above-incorporated patent application discloses a process and structure for manufacturing a low-cost substrate having high conductor density and electrical integrity by embedding the conductive patterns beneath the surface of a substrate. The substrate is an embossed substrate requiring tooling to form channels for the conductive patterns. While embossing provides a low cost and high throughput manufacturing process for the substrate base, the tooling must be remanufactured when design changes are made, as it is unique to a particular design. For low volume applications such as prototyping, the cost to tool the embossing process may be prohibitive and in general, the techniques of the present invention will provide a lower cost alternative, except in designs or portions of designs that have large areas that are recessed such as wells for integrated circuit dies.

The present invention provides an alternative that does not require custom tooling for producing channels for conductors within a substrate and provides a manufacturing process, that in general, has fewer steps and lower overall cost in producing a substrate. For some embodiments of the present invention, a punching tool is required to make a metal frame, but for other embodiments of the present invention, the metal frame is etched or mechanically drilled and therefore no punching tool is required, reducing the cost of taking a particular design to the manufacturing process. As a result, the present invention provides a low cost alternative to the techniques of the above-incorporated patent application and an alternative with a greatly reduced startup or low-volume production cost. Also, the substrate material is not deformed to generate circuit channels in the techniques of the present invention, providing use of a wider range of materials for the dielectric layer and eliminates any reduction in the mechanical properties of the dielectric that are cause by deformation. A combination of the techniques described in the above-incorporated patent application and the techniques of the present invention may be used to emboss a large area, such as an integrated circuit die well, within the manufacturing process disclosed herein.

Figure 1A:
FIG. 1A is a pictorial diagram depicting a cross sectional side view of a metal layer for forming a substrate in accordance with an embodiment of the invention.
Figure 1B:
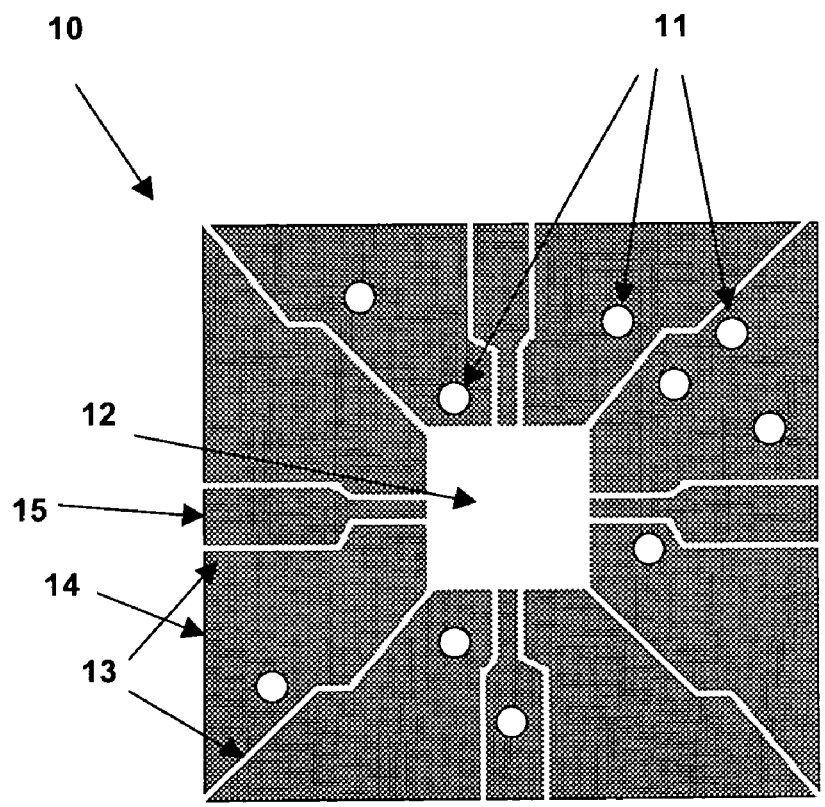
FIG. 1B is a pictorial diagram depicting a top view of a metal layer for forming a substrate in accordance with an embodiment of the invention.

Referring now to the figures and in particular to FIG. 1A, a side view of a metal layer 10 for use in preparing a substrate in accordance with an embodiment of the present invention is depicted. Metal layer 10 is used to form a substrate in a novel process that permits embedding circuits beneath the top and/or bottom surface of a substrate and isolating the circuits in channels. Metal layer 10 is generally a copper core that may be etched or die-cut, but other suitable metal layers may be used for form the core of the substrate of the present invention, such as a copper-INVAR-copper laminate. The ratio of copper to Invar can be varied to provide adjustment of the coefficient of thermal expansion (CTE) of the substrate. Holes 11 are generated in metal layer 10 to permit the passage of circuit paths through metal layer 10, while avoiding electrical contact with metal layer 10. Referring now to FIG. 1B, a top view of metal layer 10 is shown. A die aperture 12, for mounting an integrated circuit die is provided in the central area of metal layer 10. Isolating cuts 13 separate metal layer 10 into multiple conductive planes, such as power plane 15 and ground plane 14. A frame (not shown) can be provided around the periphery of metal layer 10 to hold the isolated planes in place until after the manufacture of the substrate.

Figure 2A:
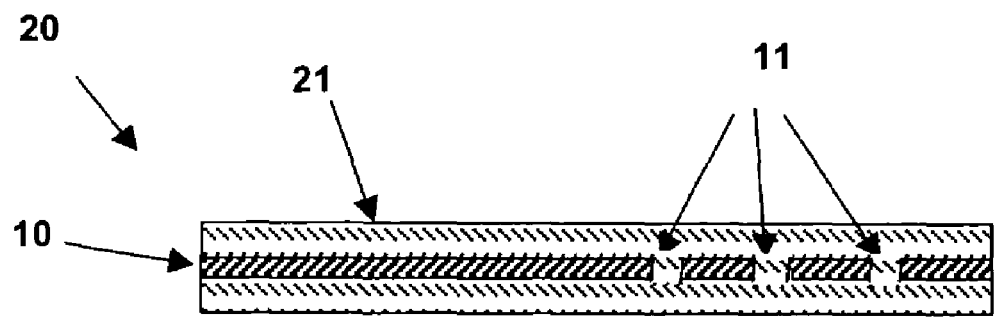
FIGS. 2A-2D are pictorial diagrams depicting cross-sectional side views of various stages of preparation of a substrate in accordance with an embodiment of the invention.

Referring now to FIG. 2A, the first stage in the preparation of a substrate 20 in accordance with an embodiment of the present invention is depicted. A dielectric outer layer 21 has been added to the top and bottom surface of metal layer 10 and can be provided by injection molding a plastic material around metal layer 10 or by laminating a dielectric such as KAPTON film or PTFE on each side of metal layer 10.

Figure 2B:
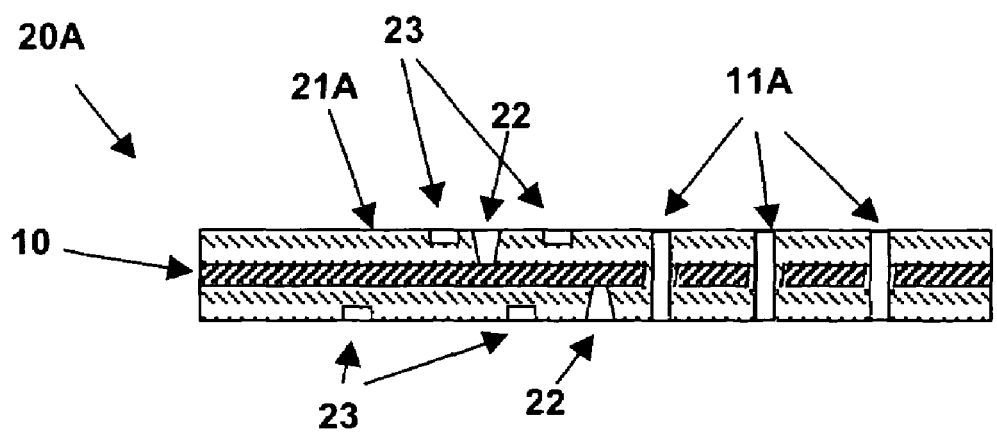

Referring now to FIG. 2B, the next stage in the preparation of substrate 20 is depicted. Substrate 20 is laser-ablated to form substrate 20A having an outer dielectric layer 21A as shown. Substrate 20A includes channels on both surfaces of the dielectric layer defining channels 23 for conductive paths, blind vias 22 for connection to ground and power planes formed in metal layer 10 and through vias 11A having a diameter smaller than holes 11 in metal layer 10, providing an insulating layer around holes 11. Blind vias 22 show a conical shape, which is preferred for addition of conductive material and can be generated by varying the laser angle or beam diameter as the dielectric material 21 is ablated.

Figure 2C:
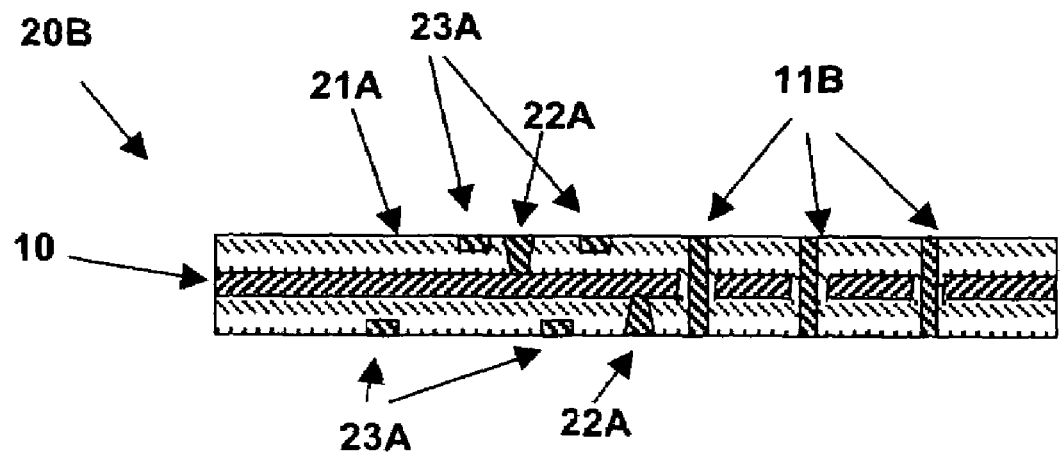
Figure 2D:
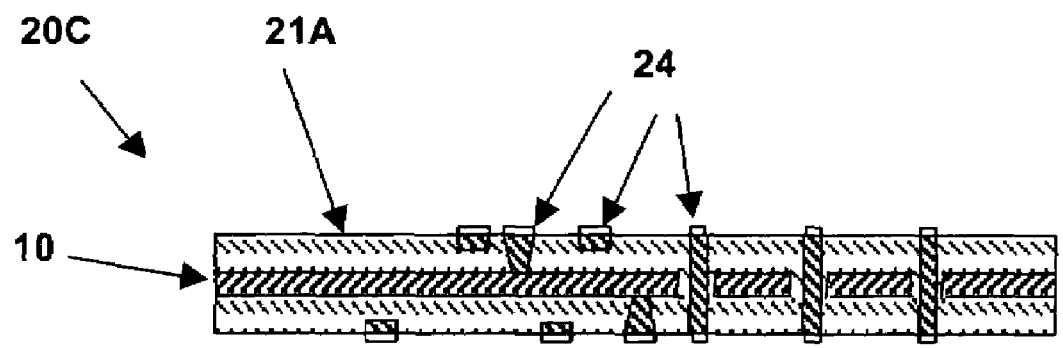

Next, referring to FIG. 2C, the next step in the preparation of substrate 20A providing a substrate 20B having conductive circuit paths. Conductive material is added within channels 23, blind vias 22 and through vias 11A to provide conductive paths 23A, conductive blind vias 22A and conductive through vias 11B. The conductive material may be a silver or copper paste that is screen printed into channels 23, blind vias 22 and through vias 11A, and planarized to remove conductive material on the surface of outer dielectric layer 21A after printing. Alternatively, an electroplating process (generally copper electroplate) can be used to add conductive material within channels 23, blind vias 22 and through vias 11A and a planarization process or chemical etching process can be used to remove excess conductive material on the surface of dielectric layer 21A.

Multiple conductive layers may be generated by repeating the steps above, adding a second outer dielectric layer to the top and/or bottom surface of substrate 20B to form a multi-layer circuit on one or both sides of substrate 20B. Further, embossing steps in accordance with the above-incorporated patent application may be used to generate large area recesses in one or both sides of outer dielectric layer 21A, such as die mounting recesses.

Finally, top plating 24 is electroplated on the conductive surfaces deposited within the channels of substrate 20B to form plated substrate 20C. Nickel-Gold is generally used to provide a barrier migration layer and to provide electrical contact for wire or chip bonding in subsequent manufacturing steps. In general, silver-nickel is an appropriate electroplating material and if a silver paste was used to form conductive channels 23A, electroplating may not be needed to provide solderable conductive connections, but may be added to eliminate oxidation.

While the figures illustrate conductive circuit channels, the figures are depicting only a portion of the total substrate. Hundreds of circuit channels 23 will generally be used in an integrated circuit design and may be oriented in any direction within the surface of substrate 20C. The present invention provides a process for forming circuits within channels in a substrate that are below the top surface of the substrate. This an improvement over the present state of the art similar to that provided by above-incorporated patent application in that the prior art generally provides only surface conductors. The channels formed by laser ablation place the conductors below the surface and the conductors are thereby insulated from adjacent conductors by the substrate. The use of laser ablation techniques further provides improvement over the techniques of the above-incorporated patent application.

Figure 3:
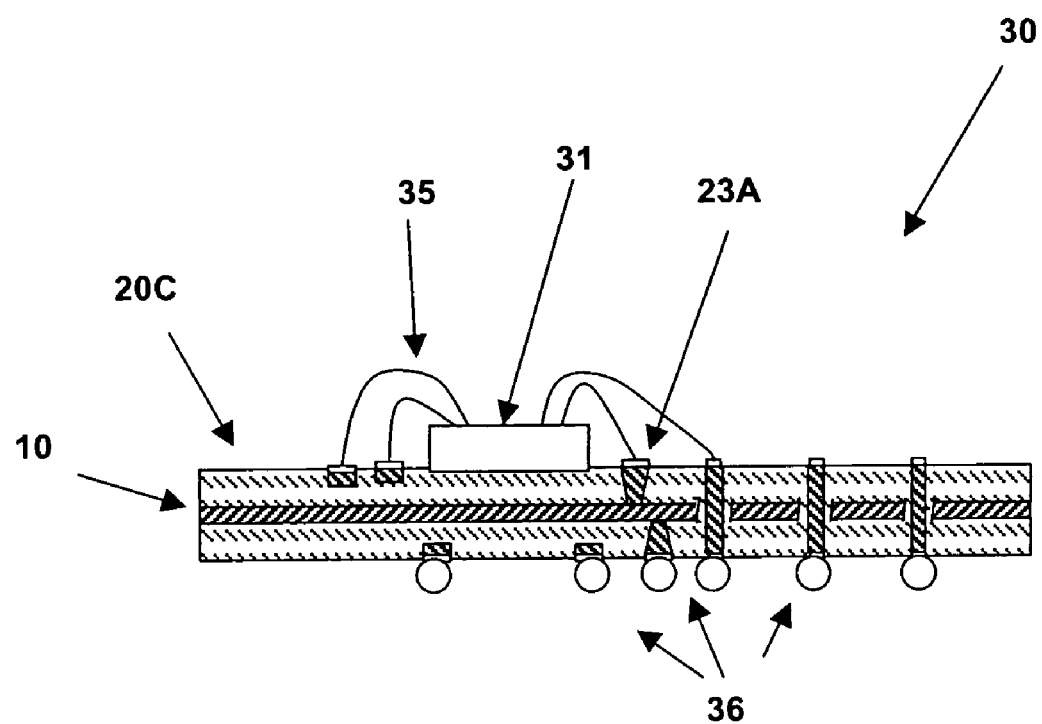
FIG. 3 is a pictorial diagram depicting an integrated circuit in accordance with an embodiment of the invention.

Referring now to FIG. 3, an integrated circuit 30 in accordance with an embodiment of the invention is depicted. A die 31 having electrical contacts is attached to substrate 20C and is electrically connected to conductive channels 23A by wires 35. Ball grid array (BGA) connections for the integrated circuit package are provided by solder balls 36 attached to the bottom channels 23A formed in substrate 20C.

The above description of embodiments of the invention is intended to be illustrative and not limiting. Other embodiments of this invention will be obvious to those skilled in the art in view of the above disclosure and fall within the scope of the present invention.

What is claimed is:

1. A method for manufacturing an integrated circuit substrate for interconnecting a semiconductor die, comprising:
   providing a first dielectric layer directly on a metal layer;
   laser-ablating the first dielectric layer to form channels on a top side of the first dielectric layer, wherein the first dielectric layer remains between the channels on the top side of the dielectric layer and the metal layer; and
   filling the channels with conductive material to form circuits for interconnecting the semiconductor die to a plurality of terminals for interfacing the semiconductor die to external devices.

2. The method of claim 1, wherein the filling is performed by paste-screening conductive material into the channels.

3. The method of claim 2, wherein the conductive material is a conductive paste.

4. The method of claim 1, wherein the filling is performed by plating conductive material into the channels.

5. The method of claim 1, wherein the providing provides the metal layer having the first dielectric layer bonded to a top side thereof.

6. The method of claim 5, wherein the providing provides the metal layer having a second dielectric layer bonded to a bottom side thereof.

7. The method of claim 6, further comprising:
laser-ablating the second dielectric layer to form bottom channels on a bottom side of the second dielectric layer; and
filling the bottom channels with conductive material to form second circuits for interconnecting the semiconductor die to the plurality of terminals.

8. The method of claim 6, further comprising:
prior to the providing, punching holes in the metal layer to provide for passage of vias from a top side of the substrate to a bottom side of the substrate;
laser-ablating via holes through the first and second dielectric layers; and
filling the via holes with conductive material to form the vias.

9. The method of claim 6, further comprising:
etching holes in the metal layer to provide for passage of vias from a top side of the substrate to a bottom side of the substrate;
laser-ablating via holes through the first and second dielectric layers; and
filling the via holes with conductive material to form the vias.

10. The method of claim 5, further comprising:
laser-ablating blind via cavities in the first dielectric layer, the cavities terminating at the metal layer; and
filling the cavities with conductive material to form blind vias.

11. The method of claim 1, further comprising machining the conductive material to planarize the substrate.

12. The method of claim 1, further comprising etching the conductive material to planarize the substrate.

13. The method of claim 1, further comprising plating areas of the conductive material to provide terminals for soldering or bonding.

14. The method of claim 1, further comprising embossing a recess in the first dielectric layer.

15. The method of claim 14, further comprising mounting the semiconductor die within the recess.

16. The method of claim 1, further comprising bonding a second dielectric layer over the top side of the first dielectric layer and the conductive material.

17. The method of claim 16, further comprising:
laser-ablating the second dielectric layer to form second channels on a top side of the second dielectric layer; and
filling the second channels with conductive material to form second circuits.

18. A method for manufacturing an integrated circuit substrate for interconnecting a semiconductor die, comprising:
providing a substrate form comprising a dielectric layer bonded to a metal layer;
laser-ablating the dielectric layer to form channels on a top side of the dielectric layer, wherein the first dielectric layer remains between the channels on the top side of the dielectric layer and the metal layer; and
filling the channels with conductive material to form circuits for interconnecting the semiconductor die to a plurality of terminals for interfacing the semiconductor die to external devices.

19. The method of claim 18, wherein the substrate form comprises the metal layer having dielectric material bonded on both sides, wherein the laser-ablating ablates channels on both sides of the substrate form, blind via holes through to the metal layer on at least one side of the substrate form and via holes through the metal layer and dielectric material, and wherein the filling deposits conductive material within the channels, blind via holes and via holes to form the circuits.

20. A method for manufacturing a semiconductor package, comprising:
providing a substrate form comprising a metal layer having dielectric material bonded to both sides thereof;
laser-ablating top and bottom sides of the substrate form to form channels on the top and bottom sides of the substrate form, wherein the dielectric material remains between the channels on the top and bottom sides of the substrate form and the metal layer;
filling the channels with conductive material to form circuits, the circuits including terminal lands on the bottom side of the substrate form;
mounting a semiconductor die to the top side of the substrate form; and
connecting terminals of the semiconductor die to the circuits whereby the semiconductor die is electrically connected to the terminal lands.

* * * * *